United States Patent
Rigbers et al.

(10) Patent No.: US 12,262,515 B2
(45) Date of Patent: Mar. 25, 2025

(54) INVERTER OF COMPACT DESIGN

(71) Applicant: SMA Solar Technology AG, Niestetal (DE)

(72) Inventors: Klaus Rigbers, Goettingen (DE); Thomas Wappler, Guxhagen (DE); Gerrit Braun, Kassel (DE); Andreas Knobloch, Kassel (DE); Matthias Rehbein, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 332 days.

(21) Appl. No.: 17/831,867

(22) Filed: Jun. 3, 2022

(65) Prior Publication Data
US 2022/0304184 A1 Sep. 22, 2022

Related U.S. Application Data

(63) Continuation of application No. PCT/EP2020/084880, filed on Dec. 7, 2020.

(30) Foreign Application Priority Data

Dec. 6, 2019 (DE) ...................... 10 2019 133 377.6

(51) Int. Cl.
H05K 7/20 (2006.01)
H02M 7/00 (2006.01)
(Continued)

(52) U.S. Cl.
CPC ............ H05K 7/209 (2013.01); H02M 7/003 (2013.01); H05K 1/181 (2013.01); H05K 7/1432 (2013.01); H05K 7/20163 (2013.01)

(58) Field of Classification Search
CPC ...... H05K 7/209; H05K 1/181; H05K 7/1432; H02M 7/003
See application file for complete search history.

(56) References Cited

U.S. PATENT DOCUMENTS 5,907,475 A * 5/1999 Babinski .................. H05K 1/14
363/141
2004/0022041 A1 2/2004 Bergmann et al.
(Continued)

FOREIGN PATENT DOCUMENTS

DE 102009058270 A1 6/2011
DE 102017127895 A1 11/2017
(Continued)

OTHER PUBLICATIONS

International Search Report dated Feb. 19, 2021 in connection with PCT/EP2020/084880.

Primary Examiner — Adolf D Berhane
Assistant Examiner — Afework S Demisse
(74) Attorney, Agent, or Firm — Eschweiler & Potashnik, LLC

(57) ABSTRACT

An inverter with a rated power of at least 3 kVA includes a first assembly which includes a first printed circuit board and a DC/AC converter stage, and a second assembly which includes a second printed circuit board and an EMC filter for the DC/AC converter stage. The first printed circuit board is mounted on a heat sink and lies substantially flat on the heat sink, and the DC/AC converter stage has converter components which comprise power semiconductors, chokes and link circuit capacitors. The chokes and the link circuit capacitors are arranged together on one side of the first printed circuit board, and the heat sink is arranged on the opposite side of the first printed circuit board, and the chokes and/or the power semiconductors are thermally connected to the heat sink via the first printed circuit board and a thermally conductive material arranged between the first printed circuit board and the heat sink. The second printed circuit board is arranged on the side of the first printed circuit board opposite the heat sink, and a metal sheet is (Continued)

arranged between the first assembly and the second assembly, and the second printed circuit board is mounted on the metal sheet.

25 Claims, 5 Drawing Sheets

(51) Int. Cl.
*H05K 1/18* (2006.01)
*H05K 7/14* (2006.01)

(56) References Cited

U.S. PATENT DOCUMENTS

| | | |
|---|---|---|
| 2015/0208524 A1 | 7/2015 | Kontani et al. |
| 2017/0279374 A1* | 9/2017 | Friebe .................. H02M 7/537 |
| 2018/0213686 A1 | 7/2018 | Kim et al. |
| 2018/0228048 A1 | 8/2018 | Blosch et al. |

FOREIGN PATENT DOCUMENTS

| | | |
|---|---|---|
| EP | 2849549 A1 | 3/2015 |
| JP | 2002325467 A | 11/2002 |

* cited by examiner

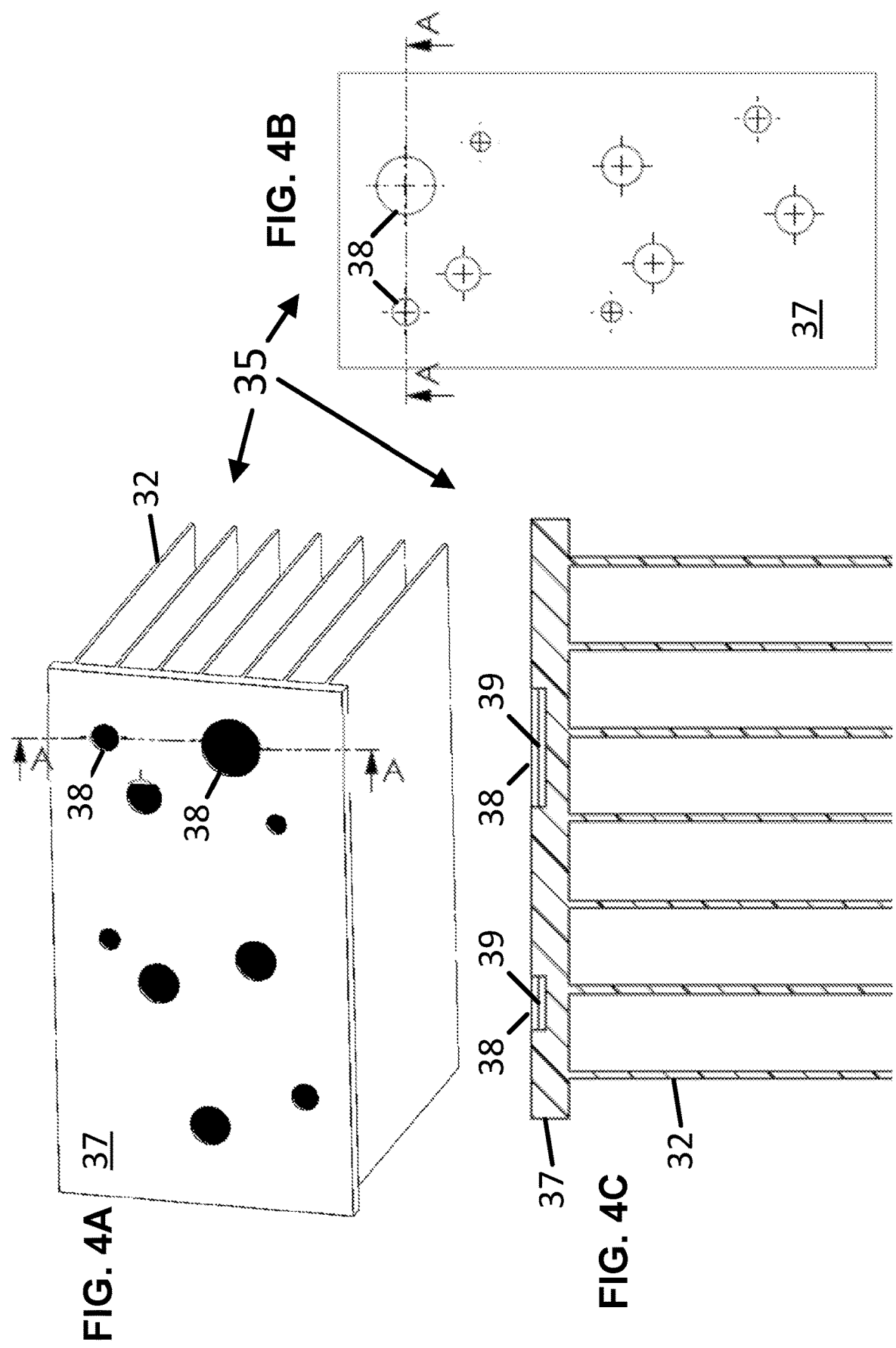

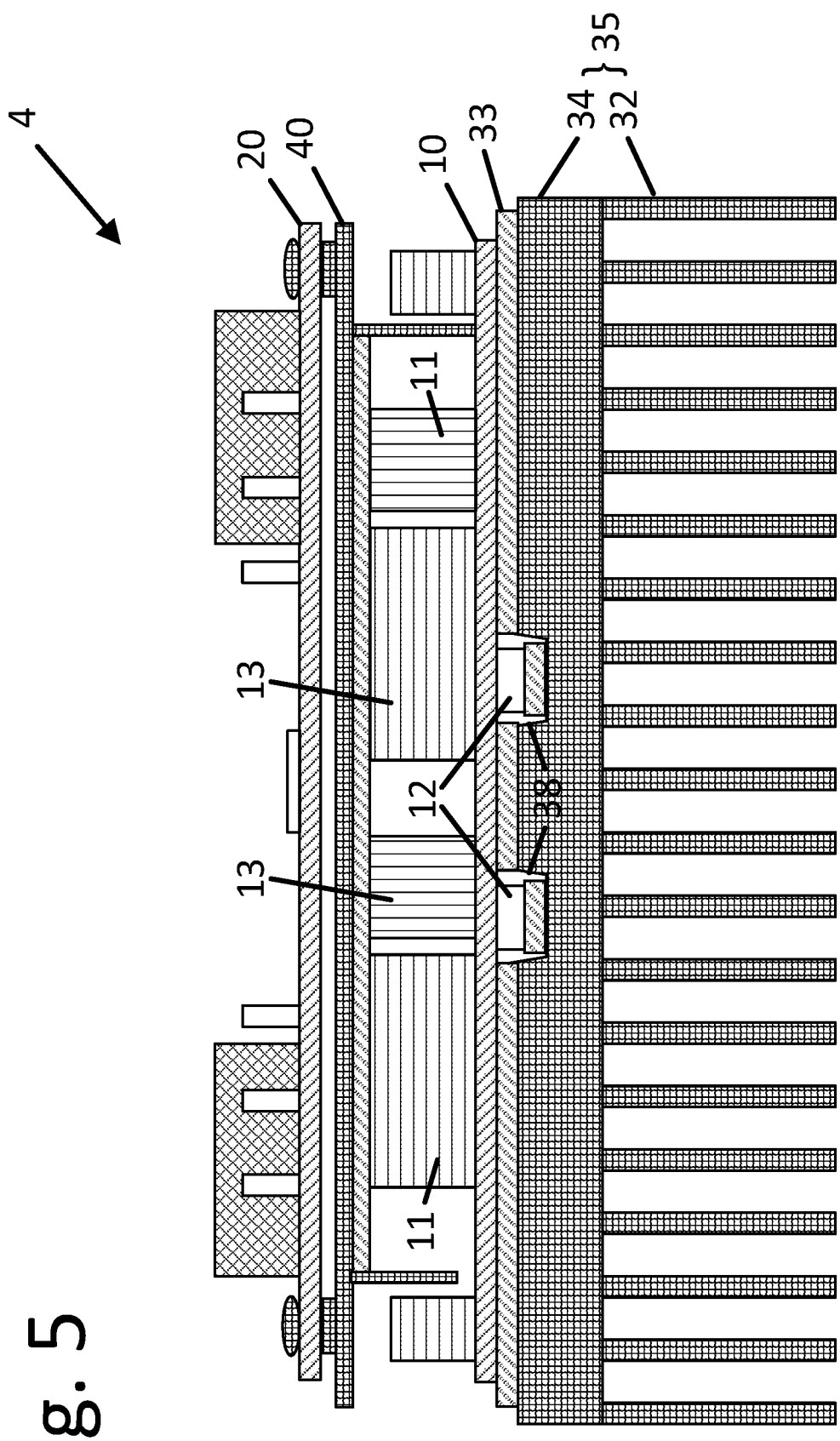

INVERTER OF COMPACT DESIGN

CROSS REFERENCE TO RELATED APPLICATIONS

This Application is a continuation of International Patent Application number PCT/EP2020/084880, filed on Dec. 7, 2020, which claims priority to German Application number 10 2019 133 377.6, filed on Dec. 6, 2019. The contents of the above-referenced Patent Applications are hereby incorporated by reference in their entirety.

FIELD

The disclosure relates to an inverter with a particularly compact design.

BACKGROUND

Inverters are power electronics devices that are configured to convert between a direct current and an alternating current. In particular, inverters which can feed electrical power from a DC source, for example a photovoltaic generator, into an AC voltage grid, or can bidirectionally exchange electrical power between a DC storage device, for example a battery, and an AC voltage grid are known.

Known inverters comprise one or more printed circuit boards with electrical and electronic components, in particular power semiconductors in a bridge circuit, as well as capacitances and inductances for shaping the desired input or output current of the inverter. The electrical and electronic components can be arranged in the inverter in very different ways, with the components usually being mounted on printed circuit boards. For this purpose, the components can be designed as what are known as SMD (surface-mounted device) components and/or as THT (through-hole technology) components, it being possible for these components to have significantly different properties and sizes.

For cooling or dissipating heat from the lossy electrical and electronic components of an inverter, it is known to arrange one or more heat sinks in or on the inverter. The components to have heat dissipated from them are in this case in direct or indirect thermal contact with such a heat sink of the inverter.

DE 10 2009 058 270 A1 discloses an inverter with a housing, a water cooler, a power module, a capacitor and an assembly in a sandwich structure, wherein the assembly comprises two printed circuit boards and a cooling plate, and the capacitor and the power module are arranged between the assembly and the water cooler.

DE 10 2017 127 895 A1 discloses an inverter in which components of a power section of the inverter are arranged on one side of a first printed circuit board, with the other side of the first printed circuit board being fixed flat on a housing wall by means of a hold-down device, which is formed as part of a cooling device, and with a second printed circuit board with a control unit of the inverter being able to be arranged on the hold-down device.

SUMMARY

The disclosure is directed to an inverter which, in comparison to known inverters, has a higher power density and is designed more compactly and more cost-effectively.

The object is achieved by way of an inverter having the features of patent claim 1. Preferred embodiments are defined in the dependent patent claims.

An inverter with more than 3 kVA rated power has a first assembly and a second assembly. The first assembly comprises a first printed circuit board and a DC/AC converter stage. The second assembly comprises a second printed circuit board and an EMC filter for the DC/AC converter stage. The first printed circuit board is mounted on a heat sink and lies substantially flat on the heat sink.

The DC/AC converter stage has converter components which comprise power semiconductors, chokes and link circuit capacitors. The chokes and the link circuit capacitors are arranged together on one side of the first printed circuit board and the heat sink is arranged on the opposite side of the first printed circuit board. The chokes and/or the power semiconductors are thermally connected to the heat sink via the first printed circuit board and a thermally conductive material arranged between the first printed circuit board and the heat sink so that the waste heat thereof arising during operation of the inverter is substantially dissipated via the heat sink.

The second printed circuit board is arranged on the side of the first printed circuit board opposite the heat sink. The second printed circuit board is mounted on a metal sheet which is arranged between the first assembly and the second assembly.

The division of the components of the inverter into two assemblies enables a compact design. In particular, the arrangement of the first printed circuit board with the converter components of the DC/AC converter stage on the heat sink ensures good removal of heat from the components which are responsible for the majority of the waste heat occurring during operation of the inverter. A particularly high power density can be achieved in connection with the removal of heat from the second printed circuit board and the components arranged on it through the metal sheet between the assemblies. In addition, the metal sheet has both a mechanically stabilizing function and a shielding function by preventing crosstalk between the assemblies, shielding the converter components from external electromagnetic fields and protecting the environment from electromagnetic emissions from the converter components.

The disclosure is based on the finding that, due to technical advances, very efficient topologies are available for an inverter, which are characterized, among other things, by the fact that their converter components, such as link circuit capacitances and chokes, can be designed to be comparatively small for stable operation. In particular, three-phase topologies, for example what are known as B6 bridge circuits, as well as what are known as flying cap topologies, which can be designed as both single-phase and three-phase, come into consideration for this.

Therefore, the link circuit capacitances and the chokes as well as any further converter components such as filter capacitors and/or current sensors, which are arranged on the first printed circuit board, can all be designed as SMD components, even for rated powers of more than 3 kVA. As an alternative or in addition, individual converter components can also be designed as printed circuit board-integrated structures, for example as planar coils, which can be formed from the conductor tracks of the printed circuit board itself.

In one embodiment, the power semiconductors and the chokes are configured as SMD components, while the link circuit capacitors are configured as THT components. This means that larger link circuit capacitances can be implemented if required. However, the THT components have connection wires that extend through the printed circuit board that supports them and are electrically contact-connected on the side opposite the THT components, for example by soldering. Thus, the connection wires of the THT components arranged on the first printed circuit board extend into a space between the first printed circuit board and the heat sink.

In one embodiment, the heat sink has a substantially flat cooling surface which, for example, comprises the base plate of an extruded aluminium heat sink. Since the first printed circuit board lies substantially flat on the heat sink, it has proven to be advantageous for the flat thermal connection of the first printed circuit board with THT components if the cooling surface of the heat sink that faces toward the first printed circuit board has recesses at the positions of the connection wires, particularly in the form of depressions. The recesses ensure a sufficiently large distance between the connection wires of the THT components and the heat sink and thus electrical insulation of same from one another.

The heat sink can comprise an extruded profile with cooling ribs arranged in the pressing direction. In this context, it has proven to be advantageous to design a recess as a trench-shaped depression in the substantially flat cooling surface of the extruded profile so that the connection wires protrude into the trench-shaped depression. The trench-shaped depression can, in one embodiment, run parallel to the cooling ribs of the heat sink and can thus be provided particularly easily even during the production of an extruded profile in order to achieve cost-effective production of the heat sink.

In one embodiment, the recesses can be arranged individually at the respective positions of the THT components or the positions of the individual connection wires of the THT components, for example, as flat milled grooves on the cooling surface. In this case, the respective diameter of the recesses can be configured such that exactly one connection wire of a THT component is arranged in each depression. With a manageable number of THT components arranged on the first printed circuit board, for example, about a dozen, all connection wires of all THT components on the first printed circuit board can each be assigned individual recesses, for example, by the surface of the heat sink being milled out selectively at the positions of the connection wires. Overall, as a result the cooling surface of the heat sink is optimally used for heat removal, for example, from the first assembly.

As an alternative or in addition, the diameter of such recesses can be configured such that all connection wires of exactly one THT component are arranged in a respective common recess. Such common recesses have a larger diameter than the recesses individually assigned to the connection wires, but in total only take up a fraction of the total surface area of the heat sink, with the result that the vast majority of the surface area of the heat sink can be thermally optimally connected to the first printed circuit board.

It goes without saying that in this case a predetermined insulation distance between the connection wire and the heat sink may also have to be maintained. In addition, the recesses can be lined with a thin electrically insulating material to ensure the insulation between the connection wires and the heat sink.

In one embodiment of an inverter according to the disclosure, the distance between the printed circuit boards is less than five centimeters and, in one embodiment, less than three centimeters. This enables a particularly compact design that is based on the overall height of the SMD components and, in particular, fully exploits the advantages of populating the first printed circuit board with SMD components.

In a further embodiment of an inverter according to the disclosure, the distance between the first printed circuit board and the cooling surface of the heat sink is on average less than one centimeter and preferably less than five millimeters. Taking into account the thermally conductive material, which bridges any structurally required minimum distances, the printed circuit board is thus in direct thermal contact with the heat sink. This ensures an ideal thermal connection of the printed circuit board and thus the first assembly to the cooling surface and thus to the heat sink.

The power semiconductors of the first assembly can be arranged on the side of the first printed circuit board that faces toward the heat sink in order to enable a direct thermal connection between the power semiconductor and the heat sink. It has proven advantageous here to provide recesses in the cooling surface of the heat sink at the positions of the power semiconductors so that the printed circuit board and the power semiconductors are at substantially the same distance from the cooling surface, that is to say, for example, are thermally coupled to the heat sink with the same thermally conductive material. The depth of the recesses relative to the cooling surface is then, for example, equal to the overall height of the power semiconductors.

In one embodiment, the second assembly of the inverter comprises filter components which are arranged on a side of the second printed circuit board that is opposite the first printed circuit board.

In one embodiment of an inverter according to the disclosure, the first assembly comprises at least two chokes which are thermally connected to the metal sheet via a thermally conductive material arranged between the chokes and the metal sheet. As an alternative or in addition, at least one of the link circuit capacitors of the first assembly can be thermally connected to the metal sheet via a thermally conductive material arranged between the link circuit capacitor and the metal sheet. In combination with the thermal connection of the chokes and/or the link circuit capacitors to the heat sink, heat removal from the converter components via the metal sheet is further improved.

In addition, the inverter can comprise a fan which generates an air flow along the metal sheet between the first assembly and second assembly and thus further contributes to the optimal dissipation of the waste heat of the inverter.

The metal sheet between the assemblies is oriented substantially parallel to the printed circuit boards and can also comprise sections which extend out of the plane of the metal sheet and into the installation space of the first assembly. These sections help both to stabilize the metal sheet and to increase the cooling capacity of the metal sheet, especially when the sections are caught by the air flow from the fan, and can also direct the air flow in a targeted manner.

In a further embodiment of an inverter according to the disclosure, the first assembly comprises a DC/DC converter stage, wherein the DC/DC converter stage is connected to a DC/AC converter stage via the link circuit capacitors. As a result, in particular, a usable range for an input voltage of the inverter can be expanded. The power semiconductors of the DC/DC converter stage can be in the form of silicon carbide or gallium nitride semiconductors. Furthermore, the power semiconductors of the DC/AC converter stage can be in the form of silicon carbide or gallium nitride semiconductors.

The first assembly of an inverter according to the disclosure can comprise a control unit which is arranged on the first printed circuit board and configured to actuate the power semiconductors by means of a pulse-width-modulated clock signal and to detect current and voltage measurement values of the DC/AC converter stage. In particular, the control unit can be configured to switch the power semiconductors at a switching frequency of at least 100 kHz. In addition, the DC/AC converter stage of the inverter can comprise at least two half-bridges, wherein the control unit is configured to switch the power semiconductors of the two half-bridges periodically with a phase offset of at least 90 degrees based on the switching period.

In one embodiment, the use of silicon carbide or gallium nitride power semiconductors in conjunction with a high switching frequency and, if necessary, a phase-shifted nesting of the clocking of several half-bridges connected in parallel in a DC/AC converter stage make it possible to generate low-distortion current curves even at the output of the half-bridges, that is to say before smoothing by the choke. As a result, both the choke and the link circuit capacitors can be designed to be even smaller, or higher nominal powers can be achieved with the same design.

An inverter according to the disclosure can be configured to exchange electrical power from at least one connectable DC voltage unit via the DC/AC converter stage and the EMC filter with a phase line of a low-voltage grid. For example, the inverter can feed electrical power into a low-voltage grid and/or draw electrical power from a low-voltage grid in a manner compliant with standards. In one embodiment, the inverter has a three-phase design and is configured to exchange electrical power on all three phases with a three-phase low-voltage grid. The DC voltage unit at the DC input of the inverter can, for example, comprise a photovoltaic generator and/or a battery.

BRIEF DESCRIPTION OF THE FIGURES

The following text further explains and describes the disclosure with reference to example embodiments illustrated in the figures.

FIGS. 4A-4C show an embodiment of a heat sink for an inverter.
FIG. 5 shows an inverter in a fourth embodiment.

DETAILED DESCRIPTION

Figure 1:
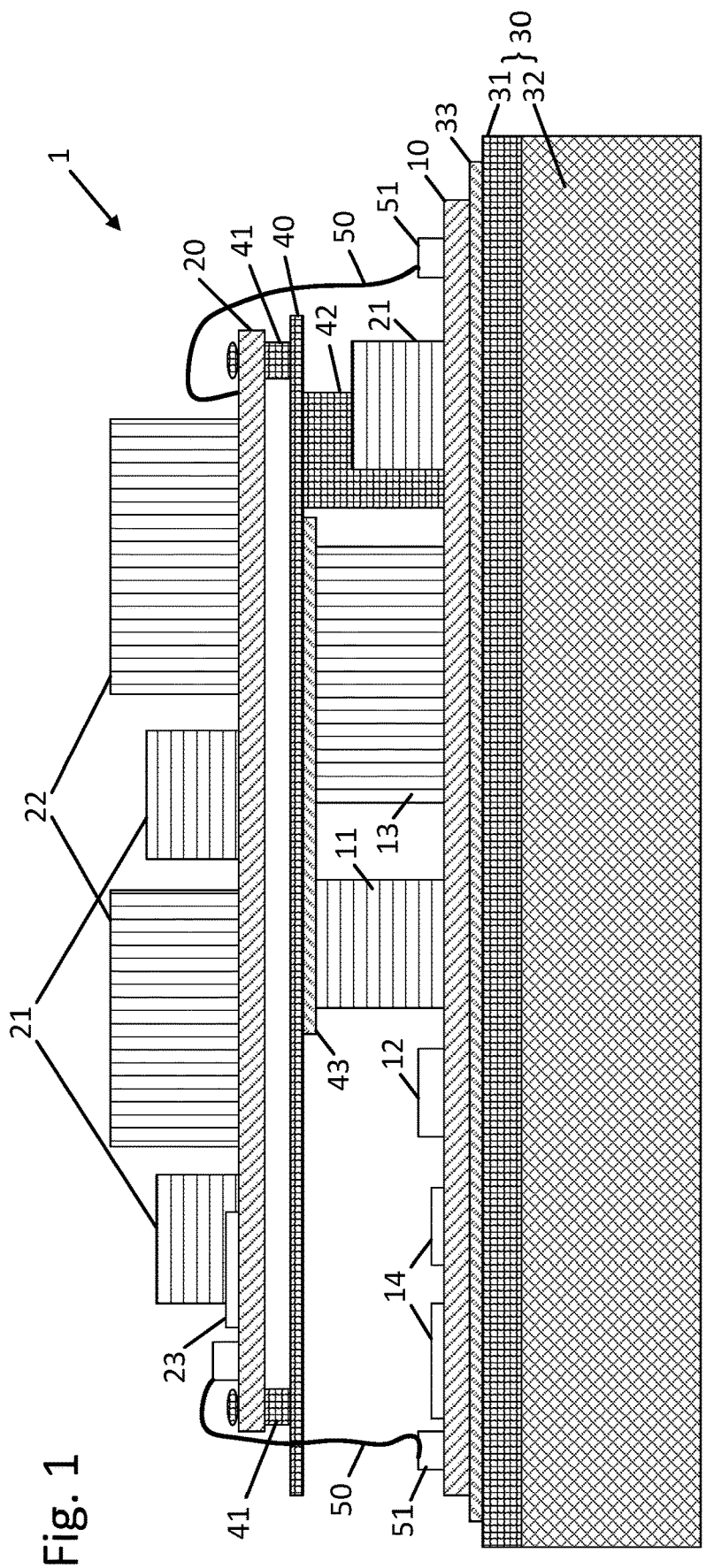
FIG. 1 shows an inverter in a first embodiment.

FIG. 1 shows an inverter 1 in a simplified cross-sectional illustration. The power electronics components of the inverter 1 are illustrated. It goes without saying that, for actual operation of the inverter, for example, as a battery inverter or photovoltaic inverter for supplying a load or for feeding into an AC voltage grid, additional electrical, electromechanical and mechanical components are required, which are not shown in FIG. 1 for the sake of clarity. This includes, in particular, DC and AC connection devices, relays, a housing and the like.

The inverter 1 comprises a first printed circuit board 10 and a second printed circuit board 20. The first printed circuit board 10 is mounted on a heat sink 30. The heat sink 30 comprises a substantially flat cooling surface 31 and cooling ribs 32 arranged thereon, the cooling ribs 32 being spaced apart from one another in such a way that cooling air can flow through between the cooling ribs 32 (cf. FIG. 2). A thermally conductive material 33 is arranged between the first printed circuit board 10 and the cooling surface 31. The thermally conductive material 33 can, in particular, be formed in one piece and cover the entire bearing surface of the first printed circuit board 10 on the heat sink 30. As an alternative, the thermally conductive material 33 can be several pieces and/or a viscous mass, with a part of said bearing surface being able to be covered.

Various power electronics converter components are arranged on the first printed circuit board 10, which interact to form a DC/AC converter stage. The DC/AC converter stage in this case comprises a link circuit capacitor 11, power semiconductors 12 and a choke 13 and, if necessary, other peripheral components such as, for example, a control unit 14 and other drivers, controllers and/or other small electronic parts (resistors, ICs and the like).

The components on the first printed circuit board 10 can, for example, be designed as surface-mounted components, that is to say as what are known as surface-mounted devices (abbreviated: SMD components). SMD components are characterized by the fact that, on the side of the printed circuit board on which the components are arranged, they are also electrically contact-connected to the conductor tracks of the printed circuit board, with the result that there is no need to access the side of the printed circuit board facing away from the components in order to assemble SMD components. In contrast to this, what are known as THT components, which are intended for through-hole assembly (THT=through-hole technology), are electrically contact-connected, for example, soldered, to the conductor tracks of the printed circuit board on the side of the printed circuit board facing away from the THT components.

If no THT components are arranged on the first printed circuit board 10 according to FIG. 1, the printed circuit board 10 can be thermally connected to the cooling surface 31 over the entire surface by means of the thermally conductive material 33. The thermally conductive material 33 is in this case generally made to be as thin as possible, so that it is ensured that the thermal resistance between the first printed circuit board 10 and the heat sink 30 is as low as possible. In one embodiment, the thermal resistance is formed as far as possible exclusively by the thermally conductive material 33 and not, for example, by air with a significantly higher thermal resistance. As a result, waste heat occurring in the converter components 11-13 during operation of the inverter 1 is effectively dissipated through the first printed circuit board 10 and via the thermally conductive material 33 into the heat sink 30 and from there to the environment.

Various other components of the inverter 1 are arranged on the second printed circuit board 20, which, for example, form an EMC filter for the DC/AC converter stage on the first printed circuit board 20. The EMC filter includes, in particular, filter capacitors 21 and filter chokes 22, it being possible, in one embodiment, for a further filter capacitor 21 to be arranged on the first printed circuit board 10. In addition, a communication processor 23, for example, is arranged on the second printed circuit board. Electrical connections 50, for example cables or busbars, which are connected to connecting elements 51, for example, sockets or screw terminals, connect the DC/AC converter stage on the first printed circuit board 10 to the EMC filter on the second printed circuit board 20. In one embodiment, the connections 50 are designed in such a way that, overall, they can transmit electrical power that corresponds at least to the rated power of the inverter 1. In addition, suitable signal lines for the transmission of internal control and operating signals can be arranged between the printed circuit boards 10 and 20.

The second printed circuit board 20 is mounted, for example, screwed or clipped, on a metal sheet 40 by a fastener 41. The metal sheet 40 rests on the link circuit capacitor 11 and the choke 13, with a thermally conductive material 43 being arranged between the metal sheet 40 and the link circuit capacitor 11 or the choke 13. As a result, in one embodiment, the position of the metal sheet 40 and thus also of the second printed circuit board 20 is fixed. In addition, a further holding plate 42 can be provided, which mechanically connects the metal sheet 40 to the first printed circuit board 10. During operation of the inverter 1, waste heat occurring in the link circuit capacitor 11 and in the choke 13 is effectively dissipated via the thermally conductive material 43 into the metal sheet 40 and from there to the environment.

Figure 2:
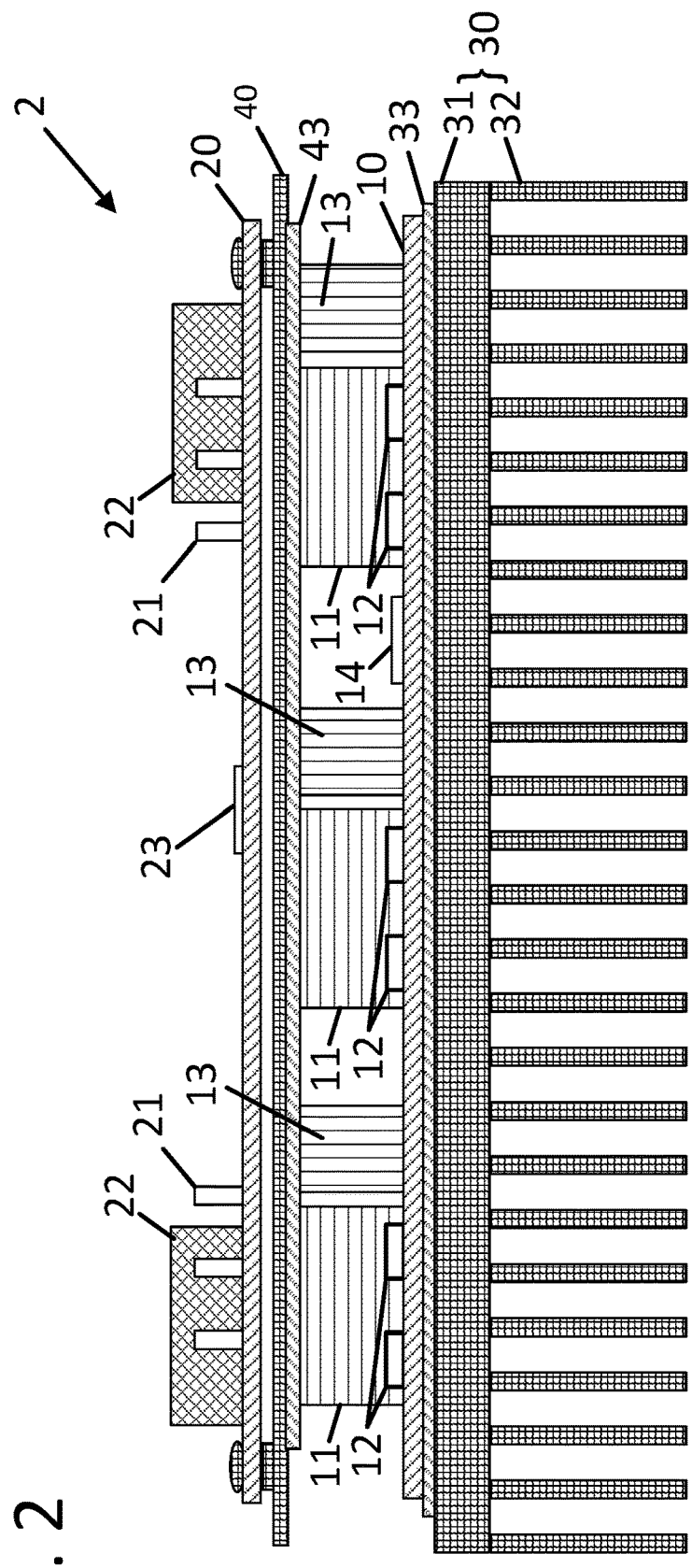
FIG. 2 shows an inverter in a second embodiment.

FIG. 2 shows a further inverter 2 in a simplified cross-sectional illustration. Parts that are basically the same as those already described in connection with FIG. 1 are provided with the same reference symbols.

A plurality of link circuit capacitors 11, power semiconductors 12 and chokes 13 are arranged on the first printed circuit board 10 as components of a DC/AC converter stage. The DC/AC converter stage and thus the inverter 2 as a whole can, in one embodiment, have a three-phase design, with the components 12, 13 also being designed in triplicate in each case, with a pair of power semiconductors 12 being able to form a half-bridge of one phase of the three-phase inverter 2.

The first printed circuit board 10 is thermally connected to the cooling surface 31 over the entire surface via the thermally conductive material 33 if the components of the DC/AC converter stage are largely designed as SMD components and, in particular, no THT components are arranged on the first printed circuit board 10. This ensures effective dissipation of the waste heat occurring in the components 11, 12, 13 on the first printed circuit board 10 into the heat sink 30 and from there to the environment.

Further components of the inverter 2 are arranged on the second printed circuit board 20, in particular an EMC filter comprising filter capacitors 21 and filter chokes 22 as well as the communication processor 23. Electrical connections between the printed circuit boards 10 and 20 are of course provided, see FIG. 1, but not shown in FIG. 2 for the sake of clarity.

The metal sheet 40 is arranged between the first printed circuit board 10 and the second printed circuit board 20. The second printed circuit board 20 is fastened to the metal sheet 40. The metal sheet 40 rests on the link circuit capacitors 11 and the chokes 13 so that the position of the metal sheet 40 and thus also of the second printed circuit board 20 is fixed. The thermally conductive material 43 is arranged between the metal sheet 40 and the link circuit capacitors 11 or the chokes 13. As a result, part of the waste heat from the link circuit capacitors 11 and the chokes 13 during operation of the inverter 2 is introduced via the thermally conductive material 43 into the metal sheet 40 and from there is dissipated to the environment.

Figure 3:
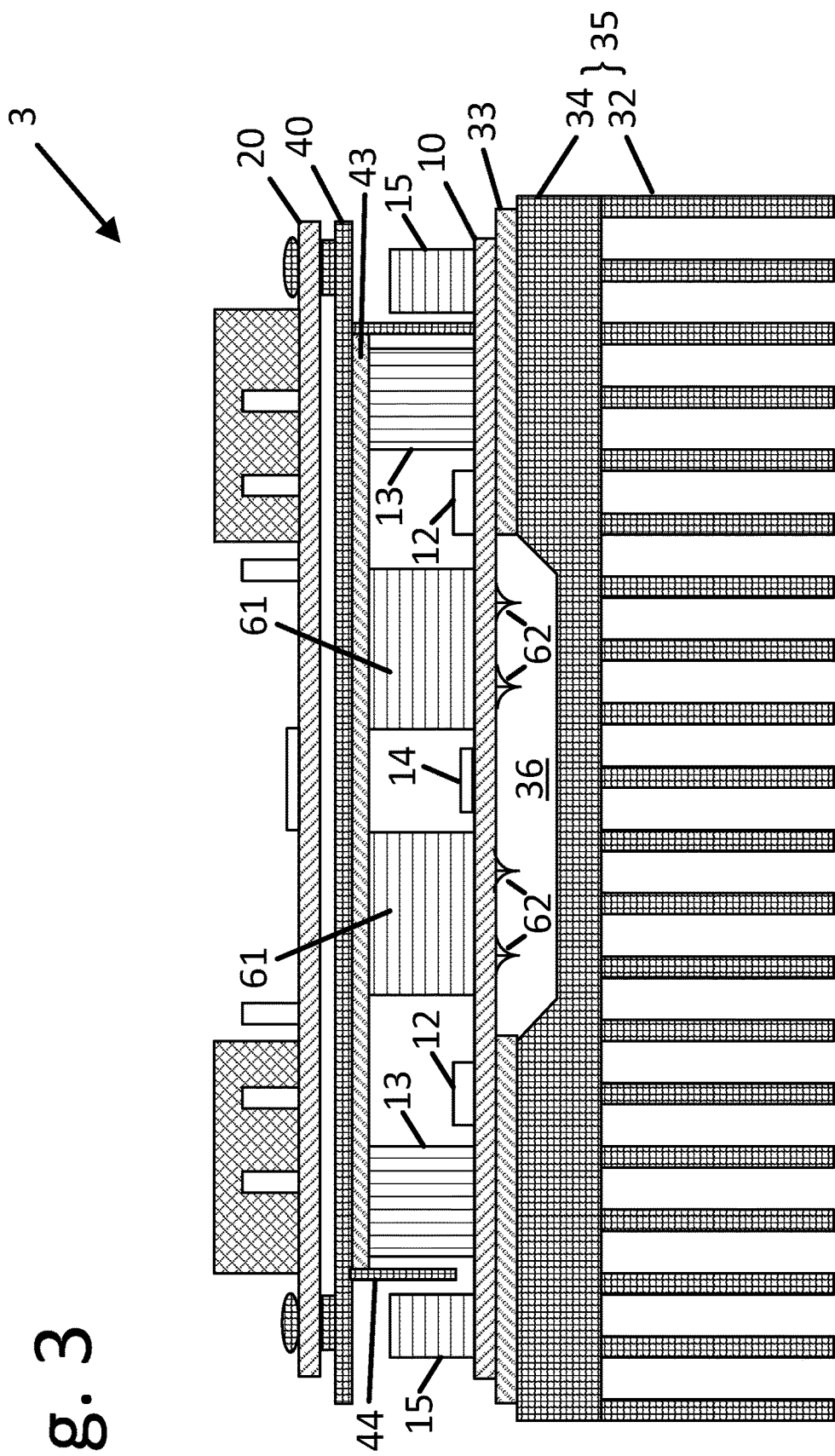
FIG. 3 shows an inverter in a third embodiment.

FIG. 3 shows a further inverter 3 in a simplified cross-sectional illustration. Parts that are basically the same as those already described in connection with FIG. 1 or FIG. 2 are provided with the same reference symbols. The inverter 3 comprises the first printed circuit board 10 and the second printed circuit board 20. The first printed circuit board 10 is mounted on the heat sink 35.

The heat sink 35 of the inverter 3 has a cooling surface 34 which comprises substantially flat surface sections, with a large part of the cooling surface 34 being located in a first plane. However, at least one of the surface sections of the cooling surface 34 lies in a second plane, such that the heat sink 35 has a trench 36. The heat sink 34 comprises cooling ribs 32, via which waste heat from the inverter 3 is released to the environment.

A DC/AC converter stage is arranged on the first printed circuit board 10 and comprises, in particular, link circuit capacitors 61, power semiconductors 12 and chokes 13. In contrast to the inverters 1 and 2 according to FIGS. 1 and 2, THT components are now also arranged on the first printed circuit board 10, here in particular the link circuit capacitors 61. The link circuit capacitors 61 have connection wires 62 which extend through the printed circuit board 10 and are fastened on the side of the printed circuit board 10 opposite the components, in particular by means of a soldered connection. In addition, a control unit 14 and possibly further capacitors 15 can be arranged on the first printed circuit board 10, which are, in one embodiment, designed as SMD components.

The first printed circuit board 10 thus on the one hand has areas in which THT components are arranged. The connection wires 62 of the link circuit capacitors 61 designed as THT components extend through the first printed circuit board 10. The first printed circuit board 10 cannot easily lie fully on the cooling surface 34 in the area of the THT components due to the connection wires 62. Instead, the THT components require a distance between the first printed circuit board 10 and the cooling surface 34, realized in FIG. 3 by the trench 36. The depth of the trench 36 is configured such that electrical insulation between the connection wires 62 and the heat sink 35 is ensured.

On the other hand, the first printed circuit board 10 has wide areas in which no THT components are arranged. These areas without THT components are thermally connected to the cooling surface 34 over the entire area via the thermally conductive material 33. In one embodiment, the components that generate a comparatively large amount of waste heat are arranged in these areas, such that the waste heat from the power semiconductors 12, the chokes 13 and, if applicable, the capacitors 15 can effectively flow through the first printed circuit board 10 and via the thermally conductive material 33 into the heat sink 35 and from there is discharged to the environment.

The metal sheet 40 is arranged between the first printed circuit board 10 and the second printed circuit board 20. The second printed circuit board 20 is fastened to the metal sheet 40. The metal sheet 40 rests on the link circuit capacitors 61 and the chokes 13 so that the position of the metal sheet 40 and thus also of the second printed circuit board 20 is fixed.

The thermally conductive material 43 is arranged between the metal sheet 40 and the link circuit capacitors 61 or the chokes 13. As a result, the waste heat from the link circuit capacitors 61 and the chokes 13 during operation of the inverter 2 is introduced via the thermally conductive material 43 into the metal sheet 40 and from there is dissipated to the environment. In addition, a guide plate 44 can be provided, which guides an air flow forced by a fan, for example, through the gap between the first printed circuit board 10 and the metal sheet 40. In addition, the metal sheet 40 can be mechanically connected to the first printed circuit board 10 via a holding plate 42 (cf. FIG. 1).

FIGS. 4a-4c shows a heat sink 35 which can be used in an inverter 1, 2, 3. The heat sink 35 is shown in FIGS. 4a-4c in different views, with FIG. 4a being a perspective view, FIG. 4b a top view of the cooling surface 37, and FIG. 4c a section along the line A-A in FIG. 4a and FIG. 4b. The heat sink 35 has a cooling surface 37 and cooling ribs 32. A plurality of depressions 38 are made in the cooling surface 37, for example by milling. In addition, a trench 36 according to FIG. 3 can be provided, which is not shown in FIG. 4 for the sake of clarity.

In particular, a first printed circuit board 10 can be mounted on the heat sink 35, on which THT components are arranged according to FIG. 3, for example the link circuit capacitors 61 or, if applicable, also the power semiconductors 12 and/or chokes 13 with a THT design. The depressions 38 are arranged on the cooling surface 37 such that they coincide with the positions of the connection wires 62 of the THT components. In addition, an insulation layer 39 can be introduced into the respective bottom of the depressions 38. This ensures sufficient electrical insulation between the heat sink 35 and the potentials on the first printed circuit board 10.

FIG. 5 shows a further inverter 4 in a simplified cross-sectional illustration. Parts that are basically the same as those already described in connection with FIGS. 1-3 are provided with the same reference symbols. The inverter 4 comprises the first printed circuit board 10 and the second printed circuit board 20. The first printed circuit board 10 is mounted on the heat sink 35. Link circuit capacitors 11 and chokes 13 are arranged on the first printed circuit board 10 and are designed as SMD components.

The heat sink 35 of the inverter 3 has a cooling surface 34 which comprises substantially flat surface sections, with a large part of the cooling surface 34 being located in a first plane. However, two surface sections of the cooling surface 34 lie in a second plane, such that the heat sink 35 has two depressions 38. The heat sink 34 comprises cooling ribs 32, via which waste heat from the inverter 3 is released to the environment.

Power semiconductors 12 are arranged on the first printed circuit board 10. The power semiconductors 12 are mounted on the side of the first printed circuit board 10 facing the heat sink 35. In this case, the power semiconductors 12 are located at the positions of the depressions 38. As a result, the first printed circuit board 10 can lie largely flat and thermally well connected to the cooling surface 34 of the heat sink 35 via the thermally conductive material 33, while the power semiconductors 12 are arranged directly on the "lowered" cooling surface 34 in the depressions 38 and are therefore thermally optimally attached to the heat sink 35. It goes without saying that a thermally conductive material can be arranged between the power semiconductor 12 and the heat sink 35 for this purpose.

What is claimed is:

1. An inverter with a rated power of at least 3 kVA, comprising:
    a first assembly which comprises a first printed circuit board and a DC/AC converter stage, and
    a second assembly which comprises a second printed circuit board and an EMC filter for the DC/AC converter stage,
    wherein the first printed circuit board is mounted on a heat sink and lies substantially flat on the heat sink,
    wherein the DC/AC converter stage has converter components which comprise power semiconductors, chokes and link circuit capacitors,
    wherein the chokes and the link circuit capacitors are arranged together on one side of the first printed circuit board, and the heat sink is arranged on the opposite side of the first printed circuit board,
    wherein the chokes and/or the power semiconductors are thermally connected to the heat sink via the first printed circuit board and a thermally conductive material arranged between the first printed circuit board and the heat sink,
    wherein the second printed circuit board is arranged on the side of the first printed circuit board opposite the heat sink,
    wherein a metal sheet is arranged between the first assembly and the second assembly, and the second printed circuit board is mounted on the metal sheet,
    wherein the first assembly comprises at least two chokes, wherein at least two of the chokes and the metal sheet are thermally connected to one another via a thermally conductive material arranged between the chokes and the metal sheet.

2. The inverter as claimed in claim 1, wherein the converter components further comprise filter capacitors and/or current sensors arranged on the first printed circuit board.

3. The inverter as claimed in claim 1, wherein all converter components are designed as surface-mounted device (SMD) components or are integrated in the first printed circuit board.

4. The inverter as claimed in claim 1, wherein the power semiconductors and the chokes are configured as SMD components, wherein the link circuit capacitors are configured as through-hole technology (THT) components.

5. The inverter as claimed in claim 4, wherein connection wires of the THT components, which are arranged on the first printed circuit board, extend into a space between the first printed circuit board and the heat sink, wherein a substantially flat cooling surface of the heat sink faces toward the first printed circuit board and has recesses at positions of the connection wires so that a predetermined distance between the connection wires and the heat sink is guaranteed.

6. The inverter as claimed in claim 5, wherein the heat sink comprises an extruded profile, wherein the recesses comprise a trench-shaped depression in the substantially flat cooling surface of the extruded profile so that the connection wires protrude into the trench-shaped depression.

7. The inverter as claimed in claim 6, wherein the heat sink has a multiplicity of cooling ribs, wherein the trench-shaped depression is oriented parallel to the cooling ribs.

8. The inverter as claimed in claim 5, wherein the recesses comprise a plurality of depressions in the cooling surface of the heat sink, wherein a diameter of the depressions is embodied such that exactly one connection wire of a THT component or the connection wires of exactly one THT component is or are arranged in one of the depressions, wherein a predetermined insulation distance between the connection wire and the heat sink is maintained.

9. The inverter as claimed in claim 1, wherein a distance between the first and second printed circuit boards is less than five centimeters.

10. The inverter as claimed in claim 1, wherein a distance between the first printed circuit board and a cooling surface of the heat sink is less than one centimeter.

11. The inverter as claimed in claim 1, wherein the power semiconductors are arranged on the side of the first printed circuit board facing toward the heat sink and are in thermal contact with the heat sink.

12. The inverter as claimed in claim 11, wherein a cooling surface of the heat sink has recesses at positions of the power semiconductors so that the first printed circuit board and the power semiconductors are at substantially the same distance from the cooling surface.

13. The inverter as claimed in claim 1, wherein the second assembly comprises filter components which are arranged on a side of the second printed circuit board opposite the first printed circuit board.

14. The inverter as claimed in claim 1, wherein the inverter comprises a fan which generates an air flow along the metal sheet between the first assembly and the second assembly.

15. The inverter as claimed in claim 1, wherein the metal sheet comprises sections which extend out of a plane of the metal sheet and into an installation space of the first assembly.

16. The inverter as claimed in claim 1, wherein the first assembly comprises a DC/DC converter stage, wherein the DC/DC converter stage is connected to the DC/AC converter stage via the link circuit capacitors.

17. The inverter as claimed in claim 16, wherein the power semiconductors of the DC/DC converter stage comprise silicon carbide or gallium nitride semiconductors.

18. The inverter as claimed in claim 1, wherein the power semiconductors of the DC/AC converter stage comprise silicon carbide or gallium nitride semiconductors.

19. The inverter as claimed in claim 1, wherein the inverter is configured to exchange electrical power from at least one connectable DC voltage unit via the DC/AC converter stage and the EMC filter with a phase line of a low-voltage grid.

20. The inverter as claimed in claim 1, wherein the inverter is configured to feed electrical power into a low-voltage grid and/or to draw electrical power from a low-voltage grid in a manner compliant with standards.

21. The inverter as claimed in claim 1, wherein the inverter has a three-phase design and is configured to exchange electrical power on all three phases with a three-phase low-voltage grid.

22. An inverter with a rated power of at least 3 kVA, comprising:
a first assembly which comprises a first printed circuit board and a DC/AC converter stage, and
a second assembly which comprises a second printed circuit board and an EMC filter for the DC/AC converter stage,
wherein the first printed circuit board is mounted on a heat sink and lies substantially flat on the heat sink,
wherein the DC/AC converter stage has converter components which comprise power semiconductors, chokes and link circuit capacitors,
wherein the chokes and the link circuit capacitors are arranged together on one side of the first printed circuit board, and the heat sink is arranged on the opposite side of the first printed circuit board,
wherein the chokes and/or the power semiconductors are thermally connected to the heat sink via the first printed circuit board and a thermally conductive material arranged between the first printed circuit board and the heat sink,
wherein the second printed circuit board is arranged on the side of the first printed circuit board opposite the heat sink,
wherein a metal sheet is arranged between the first assembly and the second assembly, and the second printed circuit board is mounted on the metal sheet,
wherein at least one of the link circuit capacitors of the first assembly and the metal sheet are thermally connected to one another via a thermally conductive material arranged between the at least one link circuit capacitor and the metal sheet.

23. An inverter with a rated power of at least 3 kVA, comprising:
a first assembly which comprises a first printed circuit board and a DC/AC converter stage, and
a second assembly which comprises a second printed circuit board and an EMC filter for the DC/AC converter stage,
wherein the first printed circuit board is mounted on a heat sink and lies substantially flat on the heat sink,
wherein the DC/AC converter stage has converter components which comprise power semiconductors, chokes and link circuit capacitors,
wherein the chokes and the link circuit capacitors are arranged together on one side of the first printed circuit board, and the heat sink is arranged on the opposite side of the first printed circuit board,
wherein the chokes and/or the power semiconductors are thermally connected to the heat sink via the first printed circuit board and a thermally conductive material arranged between the first printed circuit board and the heat sink,
wherein the second printed circuit board is arranged on the side of the first printed circuit board opposite the heat sink,
wherein a metal sheet is arranged between the first assembly and the second assembly, and the second printed circuit board is mounted on the metal sheet,
wherein the first assembly comprises a control unit arranged on the first printed circuit board and configured to actuate the power semiconductors with a pulse-width-modulated clock signal and to detect current and voltage measurement values of the DC/AC converter stage.

24. The inverter as claimed in claim 23, wherein the control unit is configured to switch the power semiconductors at a switching frequency of at least 100 KHz.

25. The inverter as claimed in claim 23, wherein the first assembly comprises a DC/DC converter stage, wherein the DC/DC converter stage is connected to the DC/AC converter stage via the link circuit capacitors, and wherein the DC/AC converter stage or the DC/DC converter stage comprises at least two half-bridges, wherein the control unit is configured to switch the power semiconductors of the two half-bridges periodically with a phase offset of at least 90 degrees based on a switching period.

\* \* \* \* \*